United States Patent
Satoh et al.

(10) Patent No.: US 8,143,928 B2
(45) Date of Patent: Mar. 27, 2012

(54) DUTY CYCLE CORRECTION SYSTEMS AND METHODS

(75) Inventors: Yasuo Satoh, Ibaraki (JP); Eric Booth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/098,154

(22) Filed: Apr. 29, 2011

(65) Prior Publication Data

US 2011/0204948 A1    Aug. 25, 2011

Related U.S. Application Data

(63) Continuation of application No. 12/400,495, filed on Mar. 9, 2009, now Pat. No. 7,940,103.

(51) Int. Cl.
*H03K 3/017*    (2006.01)
(52) U.S. Cl. ........ 327/175; 327/155; 327/158; 327/161; 327/172
(58) Field of Classification Search ........................ None
See application file for complete search history.

(56) References Cited

U.S. PATENT DOCUMENTS

| 7,057,431 | B2 | 6/2006 | Kwak | 327/158 |
| 7,199,634 | B2 | 4/2007 | Cho et al. | 327/175 |
| 7,237,136 | B2 * | 6/2007 | Li et al. | 713/401 |
| 7,579,890 | B2 | 8/2009 | Sohn | 327/175 |
| 2008/0036517 | A1 | 2/2008 | Huang et al. | 327/175 |
| 2008/0169853 | A1 | 7/2008 | Park et al. | 327/158 |

* cited by examiner

*Primary Examiner* — An Luu
(74) *Attorney, Agent, or Firm* — Dorsey & Whitney LLP (57) ABSTRACT

Duty cycle correction systems and methods of adjusting duty cycles are provided. One such duty cycle correction system includes a duty cycle adjustor and a variable delay line coupled to the output of the duty cycle adjustor. First and second phase detectors have first inputs coupled to the output of the duty cycle adjustor through an inverter and second inputs coupled to the output of the variable delay line. The phase detectors cause the delay line to align rising or falling edges of signals at the output of the delay line with rising or falling edges, respectively, of signals at the output of the inverter. The controller simultaneously causes the duty cycle adjustor to adjust the duty cycle of the output clock signal until the rising and falling edges of signals at the output of the delay line are aligned with rising and falling edges, respectively, of signals at the output of the inverter.

20 Claims, 7 Drawing Sheets

DUTY CYCLE CORRECTION SYSTEMS AND METHODS

CROSS-REFERENCE TO RELATED APPLICATION

This application is a continuation of U.S. patent application Ser. No. 12/400,495, filed Mar. 9, 2009, U.S. Pat. No. 7,940,103. This application is incorporated by reference herein in its entirety and for all purposes.

TECHNICAL FIELD

Embodiments of this invention relate to duty cycle correction systems, and, more particularly, in one or more embodiments, to a duty cycle correction system and method having two feedback control circuits.

BACKGROUND OF THE INVENTION

A variety of components are included in integrated circuits that affect the rate at which power is consumed. For example, delay lock loops are often found in memory devices and memory controllers to perform such functions as synchronizing one signal, such as a data strobe signal DQS, to another signal, such as an external clock signal. Conventional delay lock loops traditionally generate a clock signal that can be used to generate a signal, such as a DQS signal, that store data in a latch on each rising edge of the DQS signal. However, more recent memory devices are designed to latch data on both the rising edge of the DQS signal and the falling edge of the DQS signal. While an inverted version of the ClkOut signal could be used to latch data on the falling edge of the ClkOut signal, any deviation of the ClkOut signal from a 50% duty cycle would adversely affect the ability of the DQS signal to latch valid data, particularly with high-speed data transfers insofar as the transitions of the DQS signal should ideally occur at the center of the period that a data bit to be latched is valid.

Figure 1:
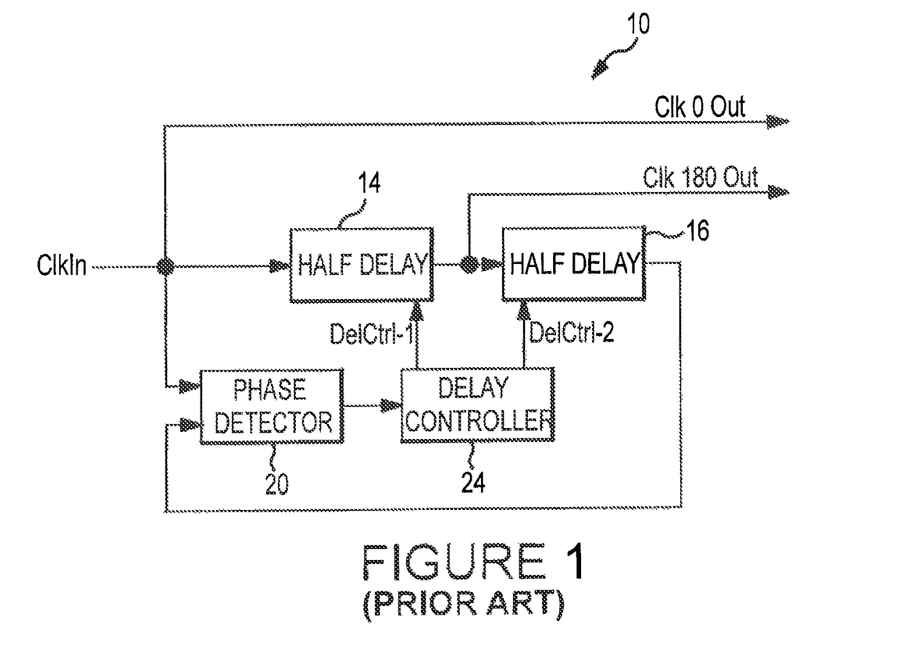
FIG. 1 is a block diagram of a prior art duty cycle correction system.

One approach to providing signals that can be used to latch data on both transitions of a clock signal uses a delay locked loop ("DLL") 10 as shown in FIG. 1. The DLL 10 includes a first variable delay line 14 that receives an input clock signal ClkIn and generates an output clock signal Clk 180 Out as a delayed version of the ClkIn signal. The amount of the delay is determined by a first delay control signal, DelCtrl-1. Similarly, a second variable delay line 16 receives the Clk 180 Out signal and generates an output signal with a delay determined by a second delay control signal, DelCtrl-2. The second variable delay line 16 can be identical to the first variable delay line 14 so that both of the delay lines 14, 16 provide the same delay to the ClkIn signal for the same values of the DelCtrl-1 and DelCtrl-2 signals. The DLL 10 also includes a phase detector 20 and a delay controller 24 coupled to the output of the phase detector 20 for adjusting the delay of the delay lines 14, 16. The phase detector 20 compares the phase of the input clock signal ClkIn to the phase of the signal output from the delay line 16 to generate a phase error signal. The phase error signal is applied to the delay controller 24. The delay controller 24 responds to the phase error signal by adjusting the value of the DelCtrl-1 and DelCtrl-2 signals in a manner that causes the delay lines 14, 16 to reduce the phase error. When the DLL 10 is locked, the signal output from the delay line 16 will have the same phase as the ClkIn signal. In an embodiment where the delay lines 14, 16 are identical to each other and the DelCtrl-1 and DelCtrl-2 signals are identical, the delay line 14 can output a CLK 180 Out signal having a phase that is 180 degrees from the phase of the ClkIn signal. The ClkIn signal, or the signal output from the delay line 16, can then be provided as a Clk 0 Out signal.

In operation, for the DLL 10 to be locked, it would be necessary for the delay lines 14, 16 to collectively delay the Clk 0 signal by 360 degrees. If both delay lines 14, 16 provide the same delay, the rising edge of the Clk 180 Out signal would then be delayed 180 degrees from the rising edge of the Clk 0 signal. As a result, the Clk 0 and Clk 180 Out signals could be used to latch data at the center of respective data valid periods.

Although the DLL 10 may provide improved performance for latching data on both transitions of the ClkIn signal, it nevertheless can suffer from a number of performance limitations. First, since the phase detector 20 determines a phase error only once each period of the ClkIn signal, it can require an undesirably long time for the DLL 10 to achieve a locked condition. Second, the rising edge of the Clk 180 Out signal is not locked to the falling edge of the ClkIn signal. As a result, any difference in the delay of the delay line 14 compared to the delay of the delay line 16 will result in a deviation of the rising edge of the Clk 180 Out signal from 180 degrees.

There is therefore a need for a duty cycle correction system and method that provides faster and more accurate control over the duty cycle of a clock signal.

BRIEF DESCRIPTION OF THE DRAWINGS

FIGS. 3A-3G is a timing diagram showing some of the signals present in the correction system of FIG. 2.

FIGS. 4A-4G is a timing diagram also showing some of the signals present in the correction system of FIG. 2.

DETAILED DESCRIPTION

Figure 2:
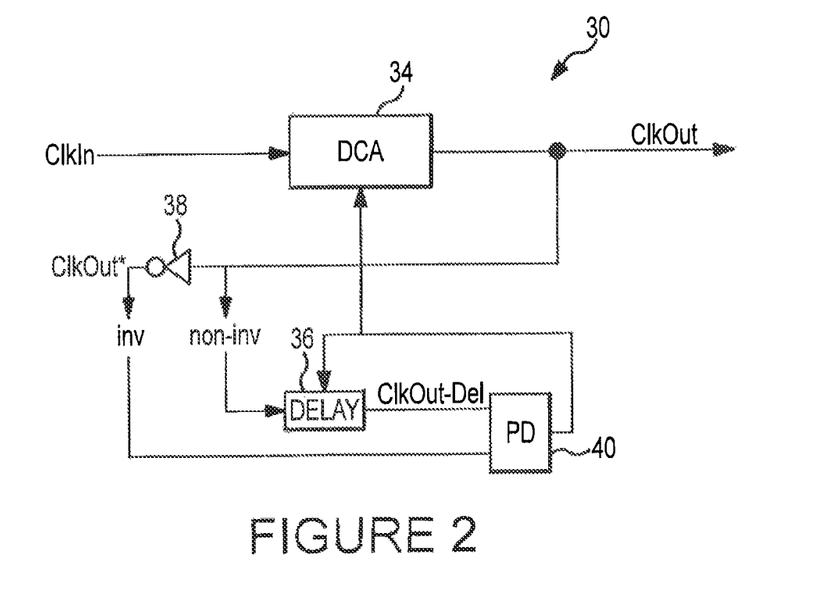
FIG. 2 is a block diagram of a duty cycle correction system according to an embodiment of the invention.
Figure 3A:
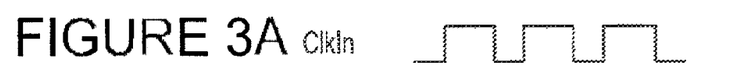
Figure 3B:
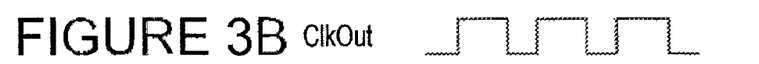
Figure 3C:
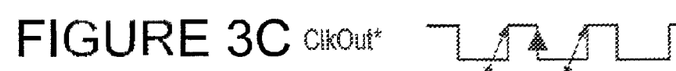
Figure 3D:
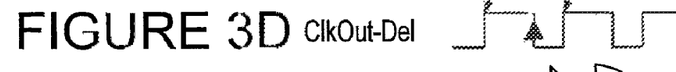
Figure 3E:
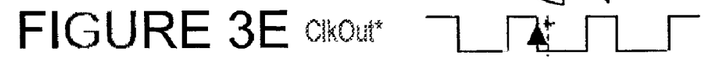
Figure 3F:
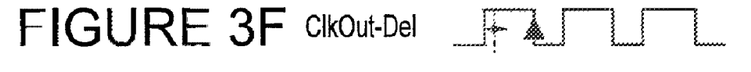
Figure 3G:
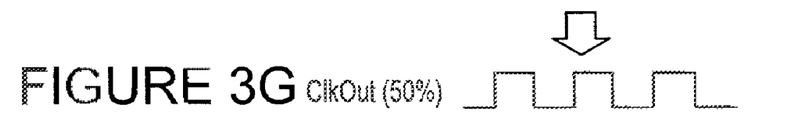

A duty cycle correction system 30 according to an embodiment of the invention is shown FIG. 2. The duty cycle correction system 30 includes a duty cycle adjustor 34 that receives an input clock signal ClkIn and delays either the rising edge of the ClkIn signal or the falling edge of the ClkIn signal to adjust the duty cycle of the ClkIn signal. The duty cycle adjustor 34 generates an output clock signal ClkOut that is applied to both a delay line 36 and an inverter 38. The inverter 38 thus generates the compliment of the ClkOut signal, i.e., ClkOut*. A phase detector 40 compares a specific transition, such as a rising edge, of the delayed ClkOut signal, i.e., the ClkOut-Del signal, with the corresponding transition of the ClkOut*signal. The phase detector 40 then adjusts the delay of the variable delay line 36 so that the compared transitions align with each other. Once the variable delay line 36 has been adjusted to align these transitions, the phase detector 40 compares the other two transitions of the ClkOut-Del signal and the ClkOut* signal. The phase detector 40 then adjusts the duty cycle adjustor 34 until those compared transitions are aligned. At that point, the ClkOut signal will have a 50% duty cycle.

The general principle of operation of the duty cycle correction system 30 is illustrated in FIG. 3. As shown in FIG. 3A, the ClkIn signal is assumed to initially have a duty cycle that varies substantially from 50%. Therefore, the ClkOut signal at the output of the duty cycle adjustor 34 will also have other than a 50% duty cycle, and it may be somewhat delayed from the ClkIn signal as shown in FIG. 3B. The timing of the rising and falling edges of the ClkOut* signal will then differ substantially from the timing of the rising and falling edges, respetively, of the ClkOut signal if the delay of the delay line 36 is initially minimal. The phase detector 40 compares the rising edges of the ClkOut* and ClkOut-Del signals and it compares the falling edges of the ClkOut* and ClkOut-Del signals to adjust variable delay line 36 until one of the compared rising edges are aligned. As shown in FIGS. 3C and 3D, the delay of the variable delay line 36 has been adjusted so that the falling edges are aligned. The phase detector 40 continues to compare the rising edges of the ClkOut* and ClkOut-Del signals, and it causes the duty cycle adjustor 34 to add delay to the rising edge of the ClkOut signal (i.e., the falling edge of the ClkOut* signal) as shown in FIGS. 3E and 3F. However, as delay is added to the falling edge of the ClkOut* signal, the delay line 36 is adjusted to maintain the falling edges of the the ClkOut* and ClkOut-Del signals remain aligned. Thus, both the duty cycle adjustor 34 and the delay line 36 are adjusted until the ClkOut signal has a 50% duty cycle as shown in FIG. 3G.

Figure 4A:
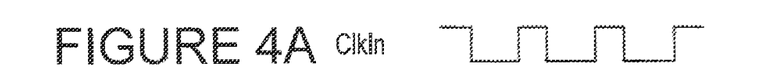
Figure 4B:
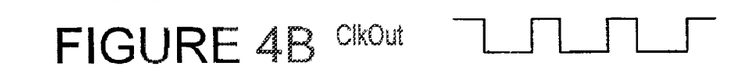
Figure 4C:
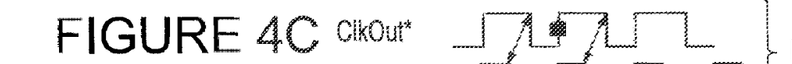
Figure 4D:
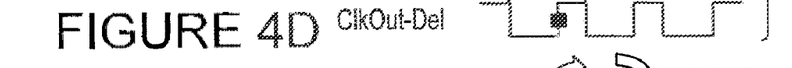
Figure 4E:
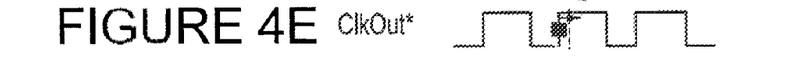
Figure 4F:
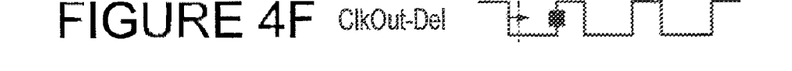
Figure 4G:
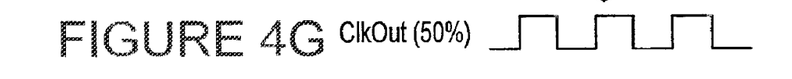

The duty cycle correction system 30 operates in substantially the same manner when the ClkIn signal has the duty cycle shown in FIG. 4A to generate the ClkOut signal as shown in FIG. 4B except that the rising edges of the ClkOut* and ClkOut-Del signals become aligned by adjusting the delay line 36, as shown in FIGS. 4C and 4D. Delay is then added to the rising edge of the ClkOut* and ClkOut-Del signals as shown in FIGS. 4E and 4F, respectively, until the duty cycle has been adjusted to 50% as shown in FIG. 4G.

The adjustment process performed by the duty cycle correction system 30 can be summarized as follows:
(a) invert output of duty cycle adjustor 34;
(b) delay output of duty cycle adjustor 34 with variable delay line 36;
(c) compare corresponding transitions of output of variable delay line 36 and inverted output of duty cycle adjustor 34 to adjust variable delay line 36 until compared edges are aligned; and
(d) compare corresponding transitions of output of variable delay line 36 and inverted output of duty cycle adjustor 34 to adjust duty cycle adjustor 34 until compared edges are aligned while adjusting variable delay line 36 to maintain alignment of compared edges.

The adjustment process can, of course, be accomplished in a different manner by different embodiments. For example, rather than inverting the ClkOut signal applied directly to the phase detector 40, the ClkOut signal could be instead inverted before being applied to the variable delay line 36, and the other input to the phase detector 40 could receive the ClkOut signal directly from the output of the duty cycle adjustor 34. Therefore, the above adjustment process can be summarized more broadly as follows:

(a) adjust the delay of ClkOut until either the rising edge of ClkOutDel is aligned with the rising edge of ClkOut* or the falling edge of ClkOutDel is aligned with the falling edge of ClkOut*; and
(b) adjust the duty cycle and delay of the ClkOut signal until the non-aligned transitions of the ClkOut signal are aligned while maintaining the alignment referenced above in (a).

Figure 5:
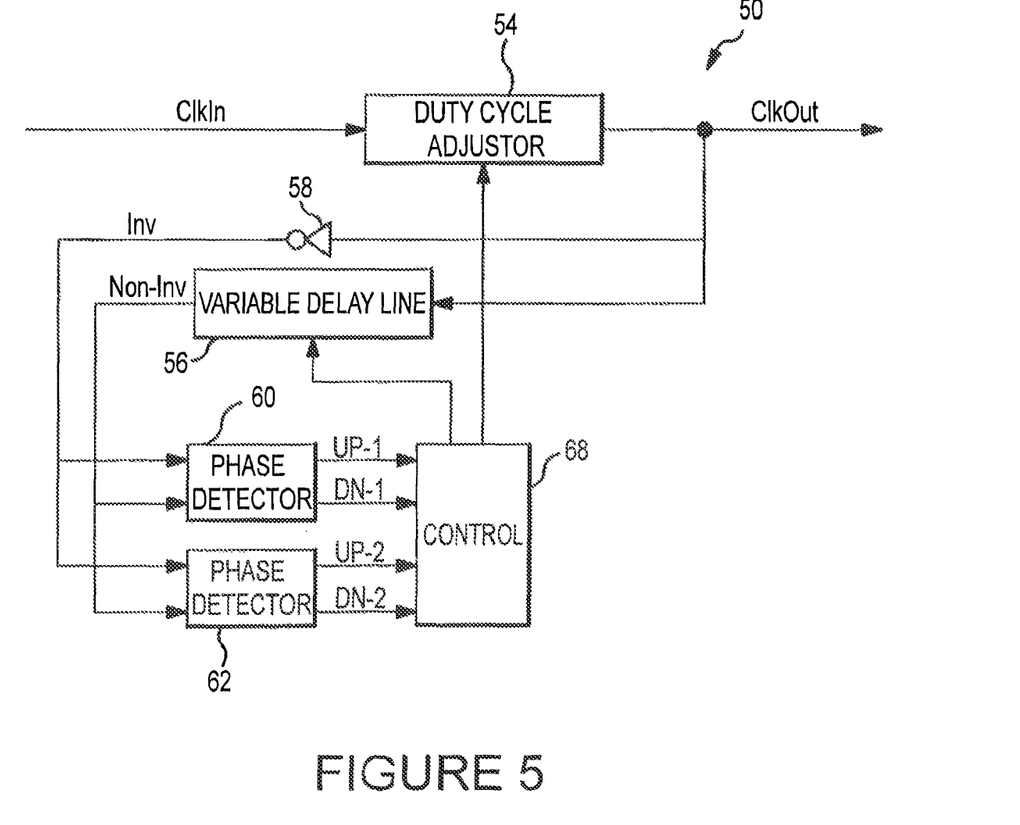
FIG. 5 is a block diagram of a duty cycle correction system according to an embodiment of the invention.

Another embodiment of a duty cycle correction system 50 is shown in FIG. 5. The duty cycle correction system 50 is similar to the duty cycle correction system 30 shown in FIG. 2. Like the duty cycle correction system 30, the duty cycle correction system 50 includes a duty cycle adjustor 54 that receives a ClkIn signal and outputs a ClkOut signal having a duty cycle that may be controlled by a control signal. A variable delay line 56 and an inverter 58 are also coupled to the output of the duty cycle adjustor 54. However, two separate phase detectors 60, 62 are used. The first phase detector 60 has a first input receiving the inverted output from the duty cycle adjustor 54, ClkOut*, and a second input receiving the output of the variable delay line 56, ClkOut-Del. The phase detector 60 applies an UP signal to a controller 68 if the signal at the output of the delay line 56 leads the signal at the output of the inverter 58 by more than a first specific delay. Similarly, the phase detector 60 applies a DN signal to the controller 68 if the signal at the output of the delay line 56 lags the signal at the output of the inverter 58 by more than a second specific delay. If the timing of the signal at the output of the delay line 56 relative to the timing of the signal at the output of the inverter 58 is within a range between the first and second specific delays, neither the UP nor the DN signal is generated. The controller 68 adjusts the delay of the variable delay line 56 responsive to the phase comparison made by the phase detector 60, as explained in greater detail below. Therefore, the variable delay line 56 is adjusted so that the rising edge of the ClkOut-Del signal is aligned to the rising edge of the ClkOut* signal as explained above with reference to FIGS. 2 and 3.

The second phase detector 62 receives the same signals that are received by the first phase detector 60, but it compares edges that are the complement of the edges that are compared by the first phase detector 60. Based on this comparison, the second phase detector 62 selectively applies UP and DN signals to the controller 68. The controller 68 then applies a duty cycle control signal to the duty cycle adjustor 54 that causes the duty cycle of the ClkIn signal to be adjusted until the falling edge of the ClkOut-Del signal is aligned with the falling edge of the ClkOut* signal, as also explained above with reference to FIGS. 2 and 3.

One of the advantages of the duty cycle correction systems 30, 50 shown in FIGS. 2 and 5 is that the respective variable delay lines 36, 56 are not in the path through which the ClkIn signal is coupled to provide the ClkOut signal. As a result, the variable delay lines 36, 56, as well as the phase detectors 40, 60, 62 and controller 68 can be powered down and then periodically powered up to correct the duty cycle of the ClkIn signal. When these other components are powered down, the duty cycle adjustor 54 can still provide a duty cycle-adjusted ClkOut signal.

Figure 6:
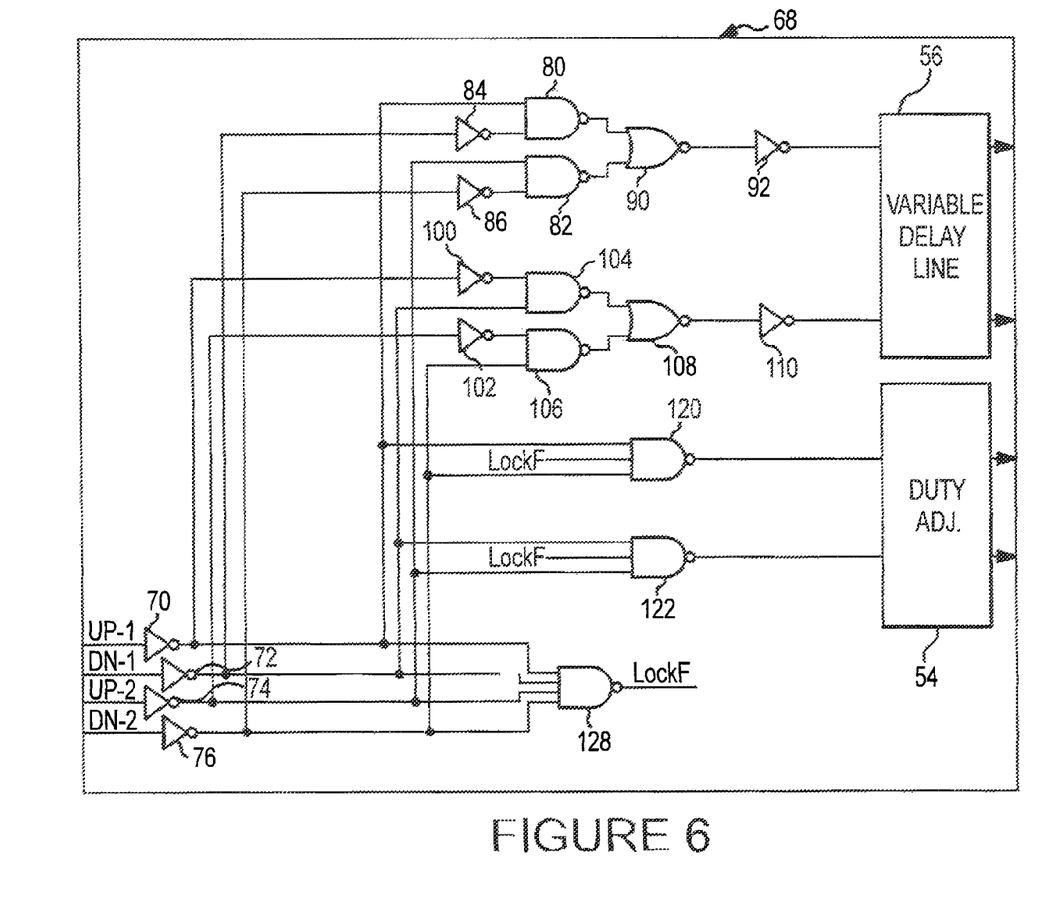
FIG. 6 is a block diagram of a duty cycle controller according to an embodiment of the invention that may be used in the duty cycle correction system of FIGS. 2 and 5 or a duty cycle correction system according to some other embodiment of the invention.

An embodiment of the controller 68 is shown in FIG. 6. The controller 68 decodes the comparisons between the rising and falling edges of the ClkOut* and ClkOut-Del signals to either increase or decrease the delay of the delay line 56 or cause the duty cycle adjustor 54 to increase either the delay of the rising edge or the delay of the falling edge of the ClkIn signal. The phase detector 60 outputs a logic "1" UP1 signal if the rising edge of the ClkOut-Del signal leads the rising edge of the ClkOut*signal. Similarly, phase detector 62 outputs a logic "1" UP2 signal if the falling edge of the ClkOut-Del signal leads the falling edge of the ClkOut* signal. In such case, the signal at the outputs of inverters 70, 74 will be logic "0", and the signals at the outputs of inverters 72, 76 will be logic "1". As a result, NAND gates 80, 82 will be enabled so that the logic "0" signals at the outputs of the inverters 70, 74, after being inverted by inverters 84, 86, cause the NAND gates 80, 82 to each output a logic "0". A NOR gate 90 will therefore output a logic "1" that causes an inverter 92 to output a logic "0," which causes the variable delay line 56 to increase the delay provided by the delay line 56. In the same manner, the phase detectors 60, 62 will output logic "1" DN1 and DN2 signals, which will cause the inverters 70-76 to output logic levels of "0101." As a result, signals applied to inverters 100, 102, NAND gates 104, 106, NOR gate 108 and inverter 110 cause a logic "0" signal to be applied to the variable delay line 56 to decrease the delay provided by the delay line 56.

If the rising edge of the ClkOut-Del signal leads the rising edge of the ClkOut* signal but the falling edge of the ClkOut-Del lags the falling edge of the ClkOut*signal, the phase detector 60 will apply logic "10" signals to the inverters 70, 72, and the phase detector 62 will apply logic "01" signals to the inverters 74, 76. In such case (assuming the LockF signal is high), a NAND gate 120 will apply an active logic "0" signal to a first input of the duty cycle adjustor 54, which causes it to increase the delay of the rising edge of the ClkIn signal. In the same manner, if the rising edge of the ClkOut-Del signal lags the rising edge of the ClkOut* signal but the falling edge of the ClkOut-Del lags the falling edge of the ClkOut*signal, the phase detector 60 will apply logic "01" signals to the inverters 70, 72, and the phase detector 62 will apply logic "10" signals to the inverters 74, 76. In such case (again assuming the LockF signal is high), a NAND gate 122 will apply an active logic "0" signal to the second input of the duty cycle adjustor 54, which causes it to increase the delay of the falling edge of the ClkIn signal. If all of the transitions of the ClkOut-Del signal are aligned with corresponding transitions of the ClkOut*signal, neither the phase detector 60 nor the phase detector 62 will output a logic "1" signal on any of its outputs thereby causing the inverters 70-76 to all output respective logic "1" signals to a NAND gate 128 thereby generating a logic "0" LockF signal. This signal will disable the NAND gates 120, 122 to prevent adjustments of the duty cycle adjustor 54 if all of the transitions of the ClkOut-Del signal are aligned with corresponding edges of the ClkOut*signal.

The operation of the controller 68 is summarized in the following Table A:

TABLE A

| RISING EDGES | FALLING EDGES | DUTY CYCLE ADJUSTMENT |
| --- | --- | --- |
| ClkOut-Del Leads | ClkOut-Del Leads | None |
| ClkOut-Del Leads | ClkOut-Del Lags | Increase Rising Edge |
| ClkOut-Del Leads | Aligned | Increase Rising Edge |
| Aligned | ClkOut-Del Lags | Increase Rising Edge |
| ClkOut-Del Lags | ClkOut-Del Lags | None |
| ClkOut-Del Lags | ClkOut-Del Leads | Increase Falling Edge |
| ClkOut-Del Lags | Aligned | Increase Falling Edge |
| Aligned | ClkOut-Del Leads | Increase Falling Edge |
| Aligned | Aligned | None |

Figure 7:
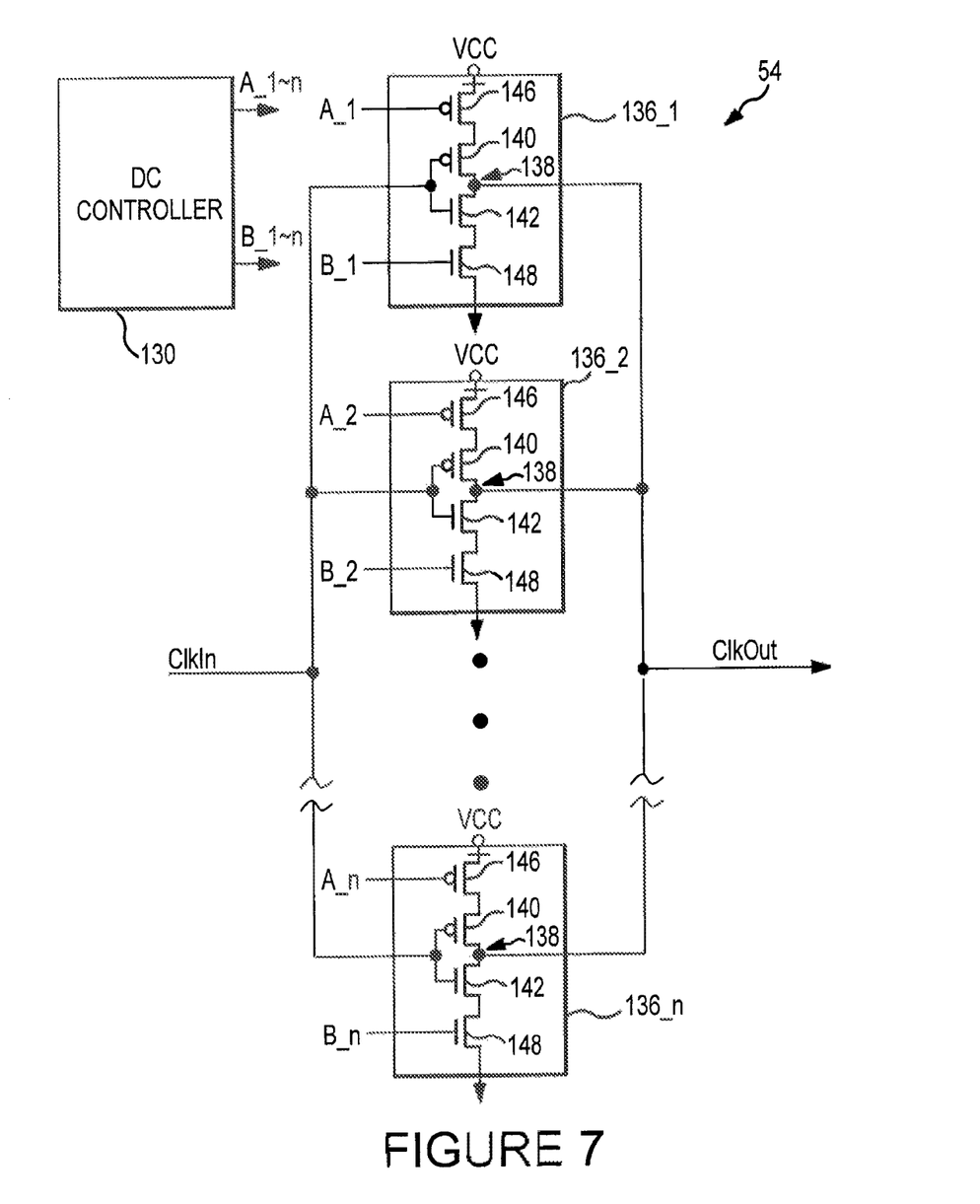
FIG. 7 is a block diagram of a duty cycle adjustor according to an embodiment of the invention that may be used in the duty cycle correction system of FIGS. 2 and 5 or a duty cycle correction system according to some other embodiment of the invention.

An embodiment of the duty cycle adjustor 54 is shown in FIG. 7. The duty cycle adjustor 54 includes a duty cycle controller 130 that is coupled to receive duty cycle commands from the controller 68 (FIG. 4) and applies a respective pair of signals A_1~n,B_1~n to each of a plurality of transition delay circuits 136 _1~_n. Each of the transition delay circuits 136 include an inverter 138 formed by a PMOS transistor 140 and an NMOS transistor 142. The gates of the transistors 140, 142 are connected to each other and to a signal input that receives the ClkIn signal. The drains of the transistors 140, 142 are connected to each other and to a signal output that provides the ClkOut signal. The inverter 138 is coupled in series with a PMOS transistor 146 and an NMOS transistor 148. The gate of the PMOS transistor 146 receives the "A" control signal while the gate of the NMOS transistor 148 receives the "B" signal.

In operation, the number of transition delay circuits 136 having their respective "A" signal inputs driven low is increased to turn ON the respective PMOS transistors 146 thereby speeding up the rising edge transitions of the ClkIn signal. Conversely, the number of transition delay circuits having their respective "A" signal inputs driven high is increased to turn OFF the respective PMOS transistors 146 thereby delaying the rising edge transitions of the ClkIn signal. In the same manner, the number of transition delay circuits 136 having their respective "B" signal inputs driven high is increased to turn ON the respective NMOS transistors 148 thereby speeding up the falling edge transitions of the ClkIn signal, and the number of transition delay circuits having their respective "B" signal inputs driven low is increased to turn OFF the respective NMOS transistors 148 thereby delaying the falling edge transitions of the ClkIn signal. Although the embodiment of the duty cycle adjustor 54 shown in FIG. 7 adjusts both the rising and falling edges of the ClkIn signal with the same circuit, other embodiments may adjust the duty cycle in another manner. For example, some embodiments may use two different variable delay lines to implement the duty cycle adjustor 54.

Figure 8:
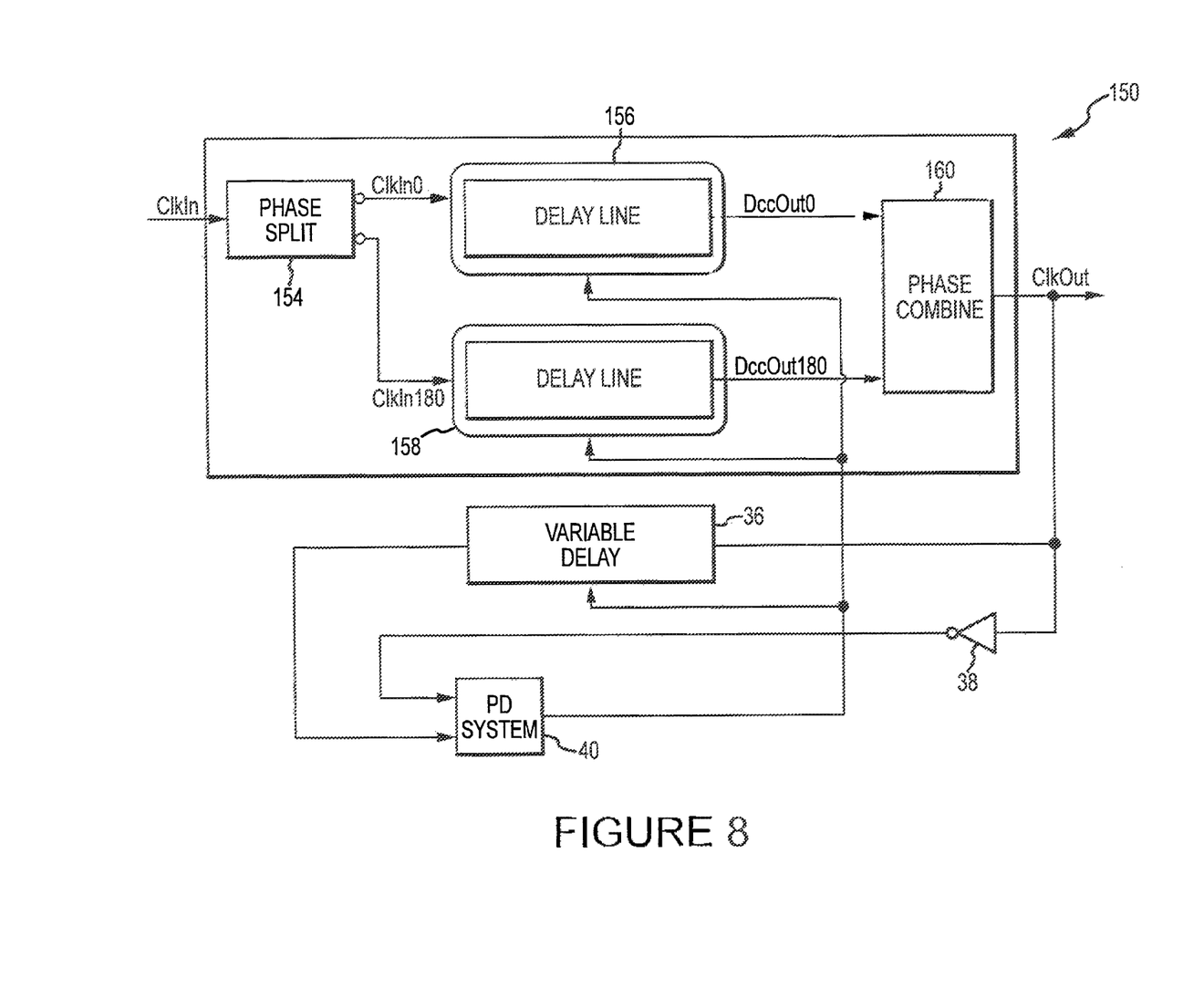
FIG. 8 is a block diagram of a duty cycle correction system according to another embodiment of the invention.

Although the present invention has been described with reference to the disclosed embodiments, persons skilled in the art will recognize that changes may be made in form and detail in other embodiments. For example, although the duty cycle correction systems 30, 50 compare the transitions of the ClkOut* signal with the corresponding transitions of the ClkOut-Del signal, other comparisons can be made. One such comparison would be to compare the transitions of the ClkOut signal with transitions of the ClkOut-Del signal after the ClkOut-Del signal has been inverted. Also, other embodiments of a duty cycle correction system may use other types of duty cycle correct adjustors. For example, FIG. 8 shows an embodiment of a duty cycle correction system 150 in which a duty cycle adjustor is implemented using a phase splitter 154, first and second delay lines 156, 158 and phase combiner 160. The system 150 also uses the components used in the embodiment of FIG. 2, which have been provided with the same references numerals, and, in the interest of brevity, an explanation of their functions will not be repeated.

The phase splitter 154 uses the ClkIn signal to generate a ClkIn0 signal having the same phase as the ClkIn signal and a ClkIn180 signal that is the complement of the ClkIn signal. Of course, if a differential clock signal is applied to the system 150, the phase splitter 154 may be omitted. The delay lines 156, 158 receive the ClkIn0 and ClkIn180 signals, respectively, and generate respective delayed signals DccOut0 and DccOut180. These signals are applied to the phase combiner 160, which generates the ClkOut signal with a rising edge responsive to the rising edge of the DccOut0 signal and a falling edge responsive to the rising edge of the DccOut180 signal.

In operation, the phase detector 40 adjusts the variable delay line 36 and the delay lines 156, 158 so that the rising edge of the inverted ClkOut signal at the output of the inverter 38 is aligned with the rising edge of the delayed ClkOut signal at the output of the variable delay line 36, and the falling edge of the inverted ClkOut signal at the output of the inverter 38 is aligned with the falling edge of the delayed ClkOut signal at the output of the variable delay line 36.

As mentioned above, persons skilled in the art will recognize that changes may be made in form and detail in other embodiments. For example, if a differential output clock is desired, the differential clock signals may be taken from the outputs of the delay lines 156, 158, although the phase combiner 160 may still be used to apply a combined signal to the variable delay line 36 and the inverter 38. Such modifications are well within the skill of those ordinarily skilled in the art. Accordingly, the invention is not limited except as by the appended claims.

We claim:

1. A system comprising:
   a variable delay line configured to delay a signal by an amount based on a first control signal to generate a delayed signal;
   an inverter configured to invert the signal to generate an inverted signal;
   a phase detector configured to receive the delayed signal and the inverted signal and compare either the rising edge transitions or the falling edge transitions of the delayed signal and the inverted signal to generate the first control signal, wherein the phase detector is further configured to compare the other of the rising edge transitions or the falling edge transitions of the delayed signal and the inverted signal to generate a second control signal; and
   a duty cycle adjustor configured to receive the second control signal and adjust a duty cycle of the signal in accordance with the second control signal.

2. The system of claim 1, wherein the phase detector is further configured to adjust the variable delay line until the rising edge transitions of the inverted signal are substantially aligned with the rising edge transitions of the delayed signal.

3. The system of claim 1, wherein the duty cycle adjustor is further configured to increase a rise time of the signal relative to a fall time of the signal or increase a fall time of the signal relative to a rise time of the signal.

4. The system of claim 1, wherein the phase detector is further configured to adjust the timing of the signal until the rising edge transitions of the delayed signal are aligned with the falling edge transitions of the signal and adjusts the duty cycle of the signal until the falling edge transitions of the delayed signal are aligned with the rising edge transitions of the signal.

5. The system of claim 1, wherein the inverter is located in one of a first signal path or a second signal path coupled to the output of the duty cycle adjustor.

6. The system of claim 1, wherein the phase detector comprises:
   a first phase detector configured to compare rising edge transitions of the delayed signal and the inverted signal to provide a rising edge control signal; and
   a second phase detector configured to compare falling edge transitions of the delayed signal and the inverted signal to provide a falling edge control signal, the rising and falling edge control signals used to adjust the variable delay line to substantially align the rising and falling edges of the inverted signal and delayed signal.

7. A method comprising:
   delaying a signal with variable delay to provide a delayed signal;
   inverting the signal to provide an inverted signal;
   adjusting the variable delay until one of the rising edge and falling edge transitions of the inverted signal is substantially aligned with one of the rising edge and falling edge transitions of the delayed signal; and
   adjusting the duty cycle of the signal until non-aligned transitions of the signal are aligned.

8. The method of claim 7, wherein adjusting the variable delay until one of the rising edge and falling edge transitions of the inverted signal is substantially aligned with one of the rising edge and falling edge transitions of the delayed signal comprises adjusting the variable delay until the rising edge transitions of the inverted signal are substantially aligned with the rising edge transitions of the delayed signal.

9. The method of claim 7, wherein adjusting the duty cycle of the signal comprises speeding up, delaying, or combinations thereof the rising edge transitions of the signal.

10. The method of claim 7, wherein adjusting the duty cycle of the signal comprises speeding up, delaying, or combinations thereof the falling edge transitions of the signal.

11. The method of claim 7, further comprising aligning one of the rising edge and falling edge transitions of the signal with the other of the rising edge and falling edge transitions of the signal and adjusting the duty cycle of the signal until the non-aligned transitions of the signal are aligned by adjusting the timing of the signal.

12. The method of claim 7, wherein adjusting the variable delay comprises comparing the delayed signal and the inverted signal to determine a phase difference and adjusting the variable delay to shift the phase of the delayed signal relative to the inverted signal until the two are aligned.

13. The method of claim 12, wherein comparing the delayed signal and the inverted signal comprises:
   comparing rising edges of the delayed signal and the inverted signal to determine a rising edge phase difference therebetween; and
   comparing falling edges of the delayed signal and the inverted signal to determine a falling edge phase different therebetween, the variable delay adjusted based on the rising and falling edge phase differences.

14. A system, comprising:
   an inverter configured to invert an output signal to provide an inverted output signal;
   a variable delay line configured to delay the output signal by a variable delay to generate a delayed signal;
   a phase detector configured to compare first transitions of the inverted output signal with first transitions of the delayed signal, and to compare second transitions of the inverted output signal with second transitions of the delayed signal; and
   a duty cycle adjustor configured to:
     adjust the variable delay until the first transitions of the inverted output signal are substantially aligned with the first transitions of the delayed signal; and
     adjust the duty cycle of the output signal until the second transitions of the inverted output signal are substantially aligned with second transitions of the delayed signal while maintaining the alignment of the first transitions of the inverted output signal and the first transitions of the delayed signal.

15. The system of claim 14, wherein the first transitions are different from the second transitions.

16. The system of claim 14, wherein the duty cycle adjustor increases, decreases, or a combination thereof a rise time of the output signal relative to a fall time of the output signal.

17. The system of claim 14, wherein the duty cycle adjustor increases, decreases, or a combination thereof a fall time of the output signal relative to a rise time of the output signal.

18. The system of claim 14, wherein the phase detector compares the falling edge transitions of the inverted output signal to the falling edge transitions of the delayed signal.

19. The system of claim 18, wherein the phase detector is configured to adjust the variable delay until the rising edge transitions of the inverted output signal are substantially aligned with the rising edge transitions of the delayed signal.

20. The system of claim 14, wherein the phase detector comprises first and second phase detectors, each of the first and second phase detectors configured to compare one of either rising or falling edges of the delayed signal and the inverted output signal.

* * * * *

UNITED STATES PATENT AND TRADEMARK OFFICE
CERTIFICATE OF CORRECTION

PATENT NO. : 8,143,928 B2
APPLICATION NO. : 13/098154
DATED : March 27, 2012
INVENTOR(S) : Yasuo Satoh et al.

Page 1 of 1

It is certified that error appears in the above-identified patent and that said Letters Patent is hereby corrected as shown below:

In column 8, lines 37-38, in Claim 13, delete "different" and insert -- difference --, therefor.

Signed and Sealed this
Twenty-ninth Day of May, 2012

David J. Kappos
*Director of the United States Patent and Trademark Office*